(12) United States Patent
Tomita et al.

(10) Patent No.: US 6,373,246 B1
(45) Date of Patent: Apr. 16, 2002

(54) CANTILEVER MAGNETIC FORCE SENSOR FOR MAGNETIC FORCE MICROSCOPY AND METHOD OF MANUFACTURING MAGNETIC FORCE SENSOR

(75) Inventors: Eisuke Tomita; Naoto Moriya, both of Tokyo (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/559,376

(22) Filed: Apr. 27, 2000

Related U.S. Application Data

(63) Continuation of application No. 08/200,820, filed on Feb. 23, 1994, now Pat. No. 6,081,113.

(30) Foreign Application Priority Data

Mar. 1, 1993 (JP) ................................. 5-40318

(51) Int. Cl.$^7$ ...................... G01R 33/02; G01R 33/12
(52) U.S. Cl. ........................... 324/244; 324/210
(58) Field of Search ............................. 324/210, 244, 324/260, 262, 226; 250/306, 307, 423 F; 369/126; 365/129, 151

(56) References Cited

U.S. PATENT DOCUMENTS

| | | | |
|---|---|---|---|
| 5,043,578 A | 8/1991 | Guethner et al. | 250/306 X |
| 5,103,174 A | 4/1992 | Wandass et al. | 324/244 |
| 5,171,992 A | 12/1992 | Clabes et al. | 250/306 |
| 5,218,262 A | 6/1993 | Taguchi et al. | 250/311 |
| 5,298,760 A | 3/1994 | Fuchs et al. | 250/492.3 |
| 5,375,087 A | 12/1994 | Moreland et al. | 250/306 X |

OTHER PUBLICATIONS

Grutter et al., "Batched Fabricated Sensors for Magnetic Force Microscopy", Oct., 1990, American Institute of Physics, pp. 1820–1822.

*Primary Examiner*—Jay Patidar
(74) *Attorney, Agent, or Firm*—Adams & Wilks

(57) ABSTRACT

A magnetic force sensor detects a magnetic force of a magnetic sample having a given magnetization direction. The magnetic force sensor comprises a magnetic probe having a tip portion. The tip portion has an electrolytically plated film of hard-magnetic material effective to maintain the magnetization direction of the probe constant and parallel to the given magnetization direction of the sample.

17 Claims, 5 Drawing Sheets

CANTILEVER MAGNETIC FORCE SENSOR FOR MAGNETIC FORCE MICROSCOPY AND METHOD OF MANUFACTURING MAGNETIC FORCE SENSOR

This application is a continuation of Ser. No. 08/200,820, filed Feb. 23, 1994, now U.S. Pat. No. 6,081,113.

BACKGROUND OF THE INVENTION

The present invention relates to magnetic force microscopy.

Heretofore, a soft-magnetic thin film of an iron/nickel alloy or the like as well as a thin film of a platinum/cobalt/chromium alloy or the like has been used to form the tip of a probe of a cantilever magnetic force sensor for detecting a magnetic force by magnetic force microscopy. For instance, some examples of such a cantilever magnetic force sensor have been disclosed in Appl. Phys. Lett., 57, 1820 (1990).

However, such conventional cantilever magnetic force sensors have the following problems. The magnetizing direction of the tip of the probe coated with a soft-magnetic thin film of an iron/nickel alloy or the like fluctuates to be the same as the direction of the lines of the magnetic force of the surface of a sample to be detected with the probe, since the soft-magnetic thin film has a small coercive force Hc. When the surface of a sample is scanned with the probe, the probe always detects only the attractive force irrespective of the direction of the lines of the magnetic force of the surface. Therefore, it was impossible to specifically discriminate the direction of the lines of the magnetic force using the probe. In other words, since the probe of this kind detects only the strength of the magnetic force in order to form an image, it was impossible to determine the recording condition of a vertical magnetic recording medium such as, for example, a photomagnetic disc or the like which records the information to be derived from the reversal of the direction of the magnetic force while the strength of the magnetic force is uniform. On the other hand, the magnetizing direction of the tip of the probe coated with a thin film of a platinum/cobalt/chromium alloy is parallel to the surface of a sample to be detected with the probe. Therefore, when the surface of a sample is scanned with the probe, it is difficult to detect the strength of the lines of the magnetic force in the direction perpendicular to the surface of the sample. For these reasons, it was difficult to determine the recording condition of a vertical magnetic recording medium using the probe. The motion of the probes will be explained with reference to the drawings attached hereto.

FIG. 4 is a graphical view showing the motion of a conventional iron/nickel alloy probe 403 of the prior art. Since an iron/nickel alloy is a soft-magnetic material and has a small coercive force Hc, the magnetizing direction of the probe 403 fluctuates to be the same as the magnetizing direction of the sample to be detected with the probe. Therefore, a constant attractive force is always imparted to the probe 403 irrespective of the magnetizing direction of the sample, and the probe moves in a manner as illustrated in FIG. 4. Hence, measurement of the distribution of the magnetism of the sample is impossible.

FIG. 5 is a graphical view showing the motion of a conventional micro-cantilever magnetic force sensor of the prior art that has a probe 404 coated with a thin film of a platinum/cobalt/chromium alloy. In this case, since the magnetizing direction of the probe 404 is parallel to the surface of the sample to be detected with the probe, it crosses the magnetizing direction of the sample at right angles. Therefore, it is impossible to detect the magnetic force of a sample using such a probe. For these reasons, the probe 404 cannot detect the distribution of the magnetism of the sample, as shown in FIG. 5.

SUMMARY OF THE INVENTION

In order to solve the above-mentioned problems, the present invention provides a cantilever magnetic force sensor for magnetic force microscopy, which is composed of a probe coated with a hard-magnetic thin film and a resiliently deflectable leaf spring having the probe at its tip.

As mentioned above, since the probe of the invention has a tip coated with a hard-magnetic thin film, the magnetizing direction of the tip of the probe is constant and is perpendicular to the surface of the sample to be detected with the probe, irrespective of the direction of the lines of the magnetic force of the surface of the sample. Therefore, the magnetic force acting on the probe is an attractive force when the direction of the lines of the magnetic force of the surface of the sample is the same as the magnetizing direction of the probe, while it is a repelling force when the direction of the lines of the magnetic force of the surface of the sample is opposite to the direction of the magnetism of the probe. Hence, for example, the probe detects the non-recorded condition of a vertical magnetic recording medium as a repelling force while detecting the recorded condition of the same as the attractive force. Using the probe of the present invention, therefore, it is possible to determine the recording condition of a vertical magnetic recording medium such as, for example, a photomagnetic disc or the like, while such determination has heretofore been difficult using the prior art.

Figure 1:
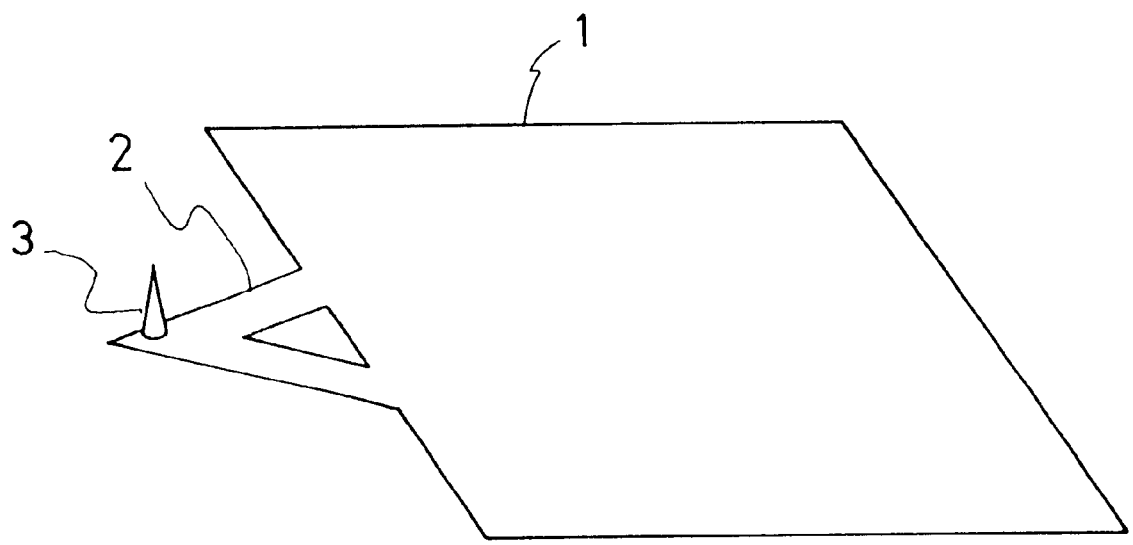
FIG. 1 is a perspective view of the cantilever of the present invention to be used for magnetic force microscopy.

In the drawings, 1 is a stainless-steel foil, 2 is a leaf spring, 3 is a probe, 4 is an iron probe, and 5 is a thin film of an iron/cobalt alloy.

DESCRIPTION OF THE PREFERRED EMBODIMENTS

Next, examples of the present invention will be explained below on the basis of the drawings attached hereto.

EXAMPLE 1

FIG. 1 is a perspective view showing a cantilever magnetic force sensor of the present invention to be used in magnetic force microscopy. A stainless steel foil 1 was machined into the form of a leaf spring as shown in FIG. 1, and a probe 3 was fitted onto the tip of the leaf spring 2 for resiliently biasing the probe 3 in response to a magnetic force between the probe and a sample to be measured.

Figure 2:
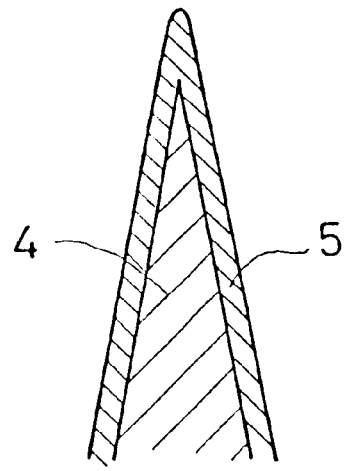
FIG. 2 is a sectional view of the probe of the cantilever of the present invention.

FIG. 2 is a graphical view showing the enlarged cross-section of the tip of the probe of the cantilever of the present invention to be used in magnetic force microscopy. A thin film 5 of an iron/cobalt alloy was plated by electrolytic plating onto the surface of an iron probe 4 that had been machined to have a needle-like shape by electrolytic abrasion.

Figure 3:
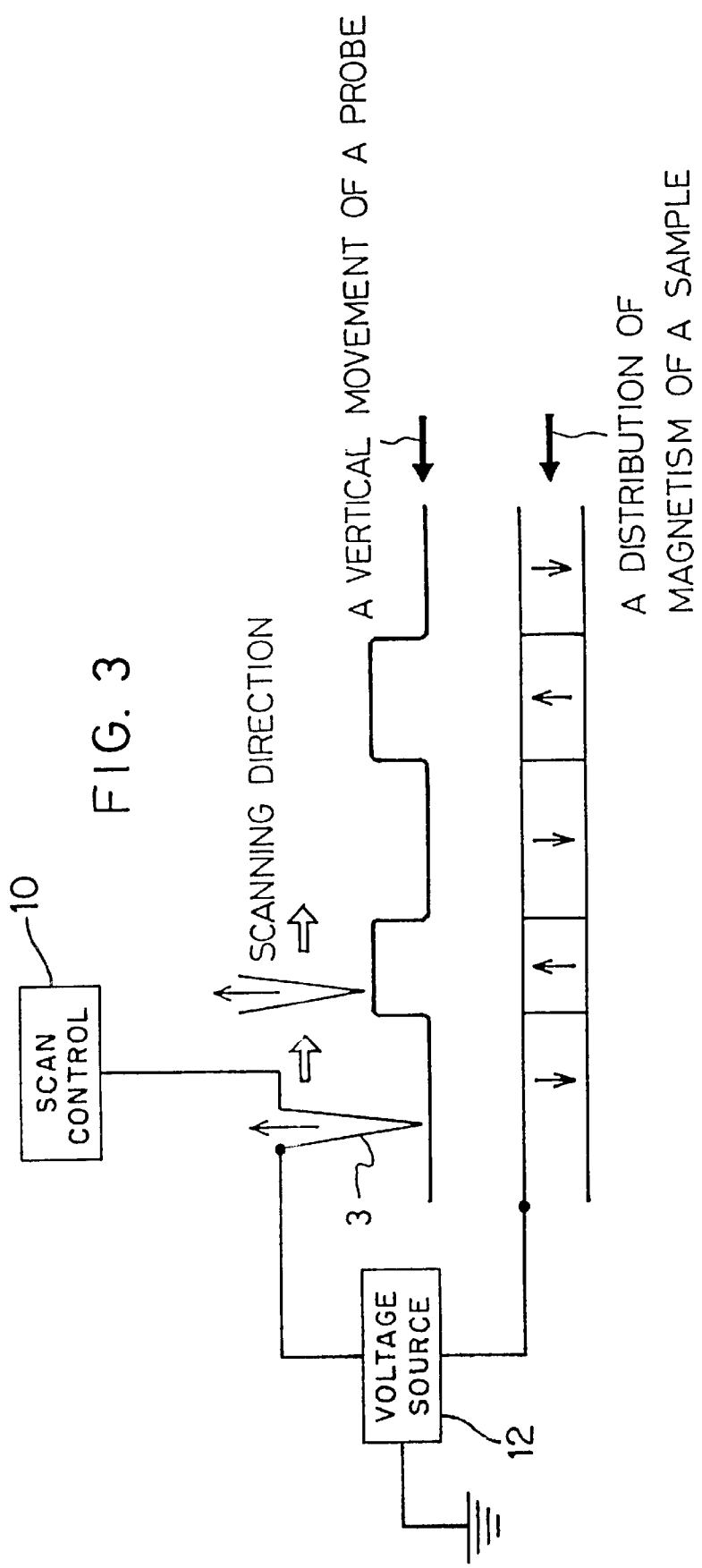
FIG. 3 is a graphical view showing the motion of an iron/cobalt alloy probe of the present invention.
Figure 4:
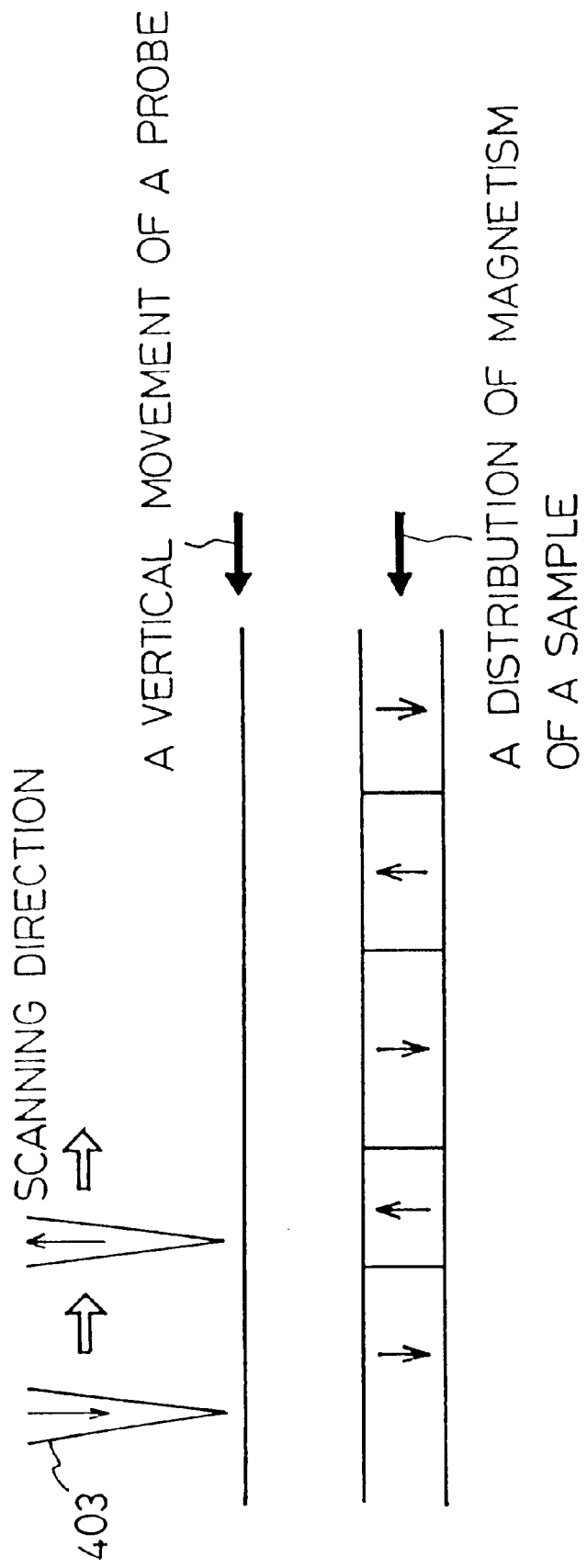
FIG. 4 is a graphical view showing the motion of a conventional iron/nickel alloy probe.
Figure 5:
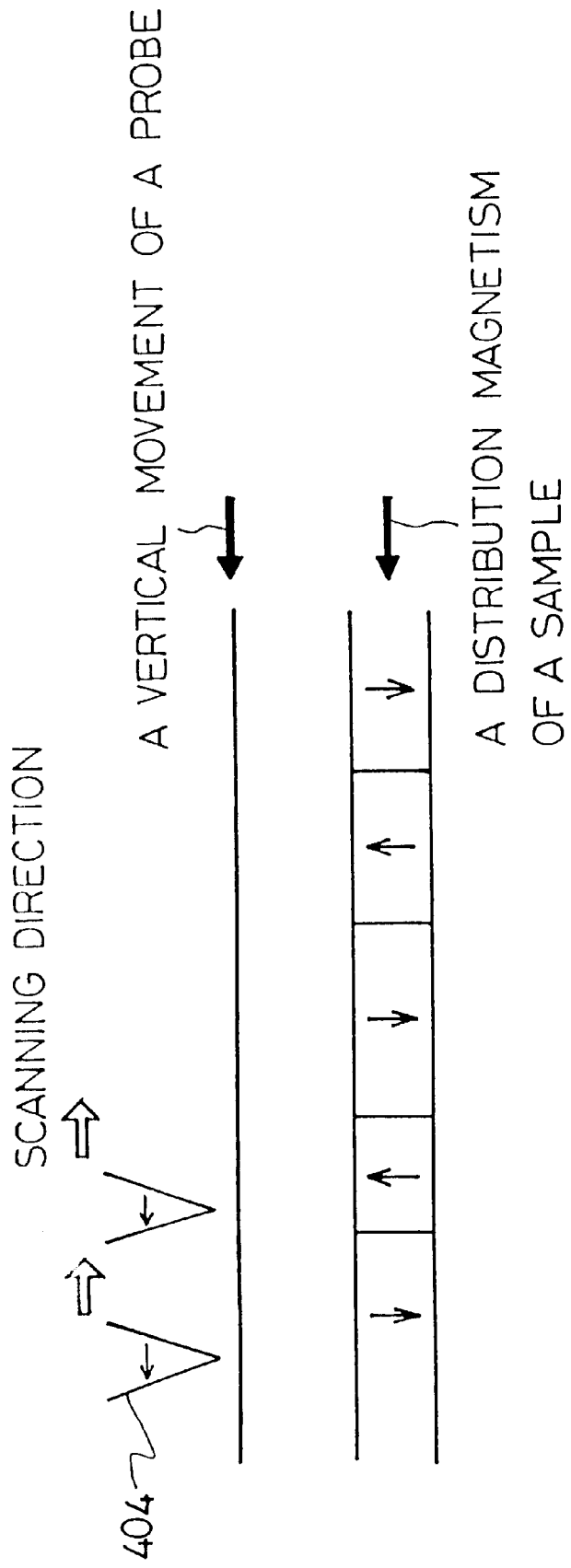
FIG. 5 is a graphical view showing the motion of a conventional platinum/cobalt/chromium alloy probe.

FIG. 3 is a graphical view showing the motion of the iron/cobalt alloy probe of the present invention in the measurement of a magnetic force of a sample by means of microscopy using the probe. The sample to be measured is a vertical magnetic recording medium. In FIG. 3, the magnetizing direction of the sample and that of the probe are represented by arrows (→), and the distribution of the magnetism of the cross section of the magnetic layer of the sample is shown therein.

An iron/cobalt alloy is a hard-magnetic material and has a large coercive force Hc. Therefore, when the probe is kept adjacent to the surface of the sample and scanned in a direction parallel to the surface of the sample, by, for example, a scan control 10 an attractive force and a repelling force act on the probe in accordance with the distribution of the magnetism of the sample, while the magnetizing direction of the probe is kept always constant. The leaf spring 2 resiliently biases the magnetic probe 3 in response to the magnetic force between the magnetic probe and the sample.

A DC voltage of several volts is imparted between the probe and the sample, by a voltage source 12 and an electrostatic attractive force of not lower than the magnetic force always acts on the two. Therefore, the force acting on the probe is the sum of the electrostatic attractive force and the magnetic force. When the magnetic force is an attractive force, then the total attractive force is increased; but when the magnetic force is a repelling force, then it will be partly subtracted from the electrostatic attractive force and the total attractive force is decreased.

In FIG. 3, since a magnetic attractive force acts on the sample and the probe when the magnetizing direction of the sample is the same as that of the sample probe while a magnetic repelling force acts thereon when the former is opposite to the latter, the force acting on the probe is increased when the two magnetizing directions are the same while it is decreased when the two magnetizing directions are opposite to each other. The electrostatic force and the magnetic force depend upon the distance between the probe and the sample, and they are increased as the probe is moved closer to the sample.

The probe is delicately moved upward and downward and controlled with a piezo-electric device so as to make the force acting between the probe and the sample constant. The probe scans the surface of the sample in the settled condition, whereupon the probe is controlled to be in the upper position when the two magnetizing directions are the same while it is controlled to be in the lower position when the two magnetizing directions are opposite to each other.

When the probe scans the surface of the sample within a micro region thereof in the above-described way while the upward and downward motion of the probe is imaged, the distribution of the magnetism of the sample may be measured.

Figure 6:
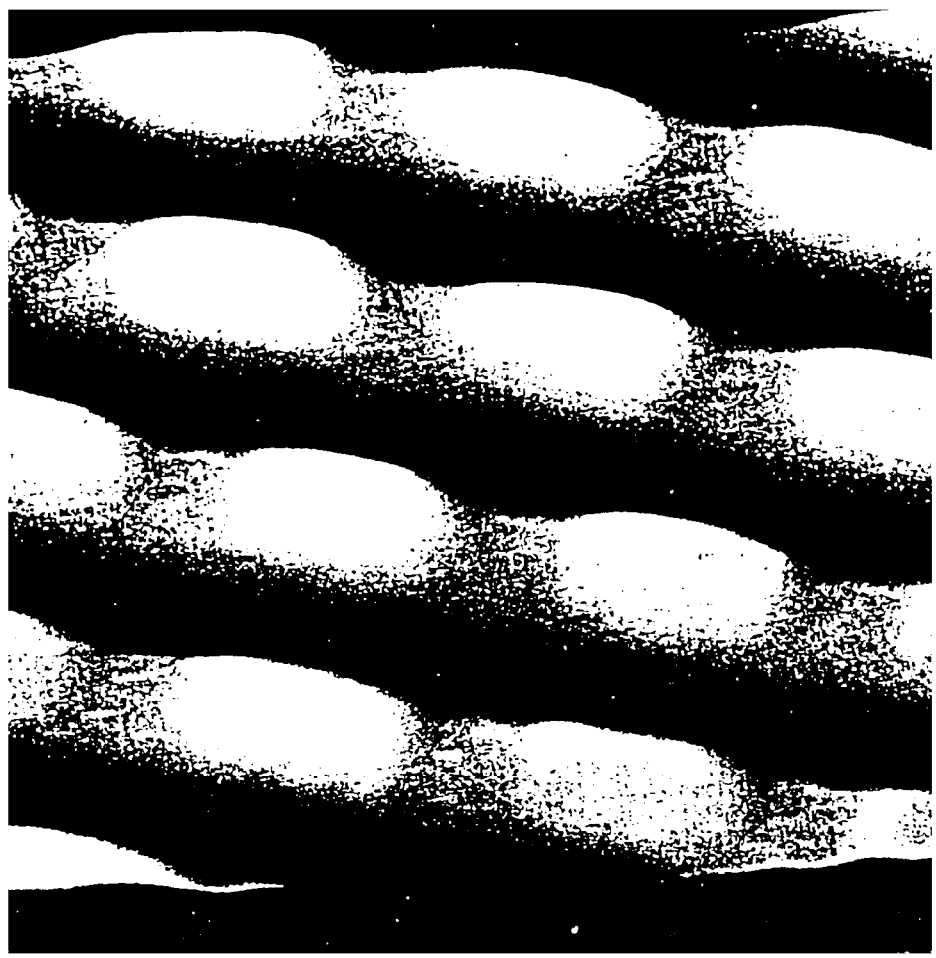
FIG. 6 is a microscopic photograph showing the magnetic force of a vertical magnetic recording medium.

FIG. 6 shows one example result of microscopic measurement, using the cantilever magnetic force sensor of the present invention, of the magnetic force of a vertical magnetic recording medium. Oval marks (recorded signals) were measured clearly.

In this way, the accurate measurement of the recording condition of a vertical magnetic recording medium has been made possible by means of the present invention.

EXAMPLE 2

A micro-cantilever magnetic force sensor composed of a leaf spring and a probe was produced by precision working of silicon. The tip of the probe was coated with a thin film of an iron/cobalt alloy by sputtering. Since the tip of the probe has a needle-like shape, the magnetizing direction of the probe is the same as the axial direction of the probe. The magnetic force of the vertical magnetic recording medium used in Example 1 was measured by microscopy using the cantilever magnetic force sensor. The recording condition of the sample was clearly measured, like in FIG. 6.

EXAMPLE 3

A cantilever magnetic force sensor composed of a stainless-steel leaf spring and a tungsten needle probe made by electrolytic abrasion was prepared. The tip of the probe was coated with a thin film of an iron/cobalt alloy by electrolytic plating. The magnetic force of the vertical magnetic recording medium used in Example 1 was measured by microscopy using the cantilever magnetic force sensor. The recording condition of the sample was clearly measured, like in FIG. 6.

EXAMPLE 4

A cantilever magnetic force sensor composed of a stainless-steel leaf spring and a tungsten needle probe made by electrolytic abrasion was prepared. The tip of the probe was coated with a thin film of a cobalt/nickel alloy by electrolytic plating. The magnetic force of the vertical magnetic recording medium used in Example 1 was measured by microscopy using the cantilever magnetic force sensor. The recording condition of the sample was clearly measured, like in FIG. 6.

EXAMPLE 5

A micro-cantilever magnetic force sensor composed of a leaf spring and a probe was produced by precision working of silicon. The tip of the probe was coated with a thin film of a cobalt/nickel alloy by sputtering. Since the tip of the probe has a needle-like shape, the magnetizing direction of the probe is the same as the axial direction of the probe. The magnetic force of the vertical magnetic recording medium used in Example 1 was measured by microscopy using the cantilever magnetic force sensor. The recording condition of the sample was clearly measured, like in FIG. 6.

As has been explained above, the cantilever magnetic force sensor for magnetic force microscopy of the present invention is composed of a probe coated with a hard-magnetic thin film and a leaf spring having the probe at its tip. Using the cantilever of the invention, it has been made possible to accurately measure the recording condition of a vertical magnetic recording medium, while such measurement has heretofore been difficult using the prior art.

What is claimed:

1. A magnetic force sensor for detecting a magnetic force of a magnetic sample having a given magnetization direction, the magnetic force sensor comprising: a magnetic probe having a tip portion, the tip portion having an electrolytically plated film of hard-magnetic material effective to maintain the magnetization direction of the probe constant and parallel to the given magnetization direction of the sample; and means for resiliently biasing the magnetic probe with respect to the magnetic sample in response to the magnetic force between the magnetic probe and the magnetic sample, the means for resiliently biasing comprising a leaf spring fixedly supporting the magnetic probe.

2. A magnetic force sensor as claimed in claim 1; wherein the electrolytically plated film of hard-magnetic material comprises an alloy of iron and cobalt.

3. A magnetic force sensor as claimed in claim 2; wherein the magnetic probe and the means for biasing art comprised of silicon.

4. A magnetic force sensor as claimed in claim 2; wherein the means for biasing is comprised of stainless steel and the magnetic probe comprises a tungsten needle probe.

5. A magnetic force sensor as claimed in claim 1, wherein the electrolytically plated film of hard-magnetic material comprises an alloy of cobalt and nickel.

6. A magnetic force sensor as claimed in claim 5; wherein the means for biasing is comprised of stainless steel and the magnetic probe comprises a tungsten needle probe.

7. A magnetic force sensor as claimed in claim 5; wherein the magnetic probe and the means for biasing are comprised of silicon.

8. A force sensor for magnetic force microscopy for detecting a magnetic force of a magnetic sample having a given magnetization direction, the force sensor comprising: a magnetic probe for scanning a surface of the sample, the magnetic probe having an electrolytically plated hard-magnetic thin film having a magnetization direction which is maintained constant and parallel to the given magnetization direction of the magnetic sample during scanning of the magnetic probe relative to the surface of the magnetic sample; and a leaf spring having the magnetic probe attached thereto at a free end thereof, the leaf spring being resiliently deflectable in response to the magnetic force between the magnetic probe and the magnetic sample.

9. A force sensor as claimed in claim 8; wherein the electrolytically plated hard-magnetic thin film is comprised of an iron/cobalt alloy.

10. A force sensor as claimed in claim 9; wherein the leaf spring and magnetic probe are comprised of silicon.

11. A force sensor as claimed in claim 9; wherein the leaf spring is comprised of stainless steel and the magnetic probe comprises a tungsten needle probe.

12. A force sensor as claimed in claim 8; wherein the leaf spring is comprised of stainless steel, the magnetic probe comprises a tungsten needle probe and the electrolytically plated hard-magnetic thin film is comprised of a cobalt/nickel alloy.

13. A force sensor as claimed in claim 8; wherein the leaf spring and magnetic probe are comprised of silicon and the electrolytically plated hard-magnetic thin film is comprised of a cobalt/nickel alloy.

14. A magnetic force sensor as claimed in claim 8; wherein the magnetic force sensor comprises a cantilever member.

15. A method of manufacturing a magnetic force sensor for detecting a magnetic force of a magnetic sample having a given magnetization direction, comprising the steps of: providing a magnetic probe having a tip portion; forming a film of hard-magnetic material on the tip portion of the magnetic probe by electrolytic plating effective to maintain the magnetization direction of the magnetic probe constant and parallel to the given magnetization direction of the sample; and supporting the magnetic probe with a biasing member comprised of a leaf spring so that the magnetic probe is resiliently biased with respect to the magnetic sample in response to the magnetic force between the magnetic probe and the magnetic sample.

16. A method according to claim 15; wherein the forming step comprises forming a film of an alloy of iron and cobalt on the tip portion of the magnetic probe by electrolytic plating.

17. A magnetic force sensor for detecting a magnetic force of a magnetic sample having a given magnetization direction, the magnetic force sensor comprising: a cantilever member having a free end; and a magnetic probe fixed to the free end of the cantilever member and having a tip portion, the tip portion having an electrolytically plated film of hard-magnetic material effective to maintain the magnetization direction of the probe constant and parallel to the given magnetization direction of the sample.

* * * * *